United States Patent [19]
Frey

[11] Patent Number: 5,528,197
[45] Date of Patent: Jun. 18, 1996

[54] VOLTAGE CONTROLLED AMPLIFIER

[75] Inventor: Douglas R. Frey, Bethlehem, Pa.

[73] Assignee: Analog Devices, Inc., Norwood, Mass.

[21] Appl. No.: 469,439

[22] Filed: Jun. 6, 1995

[51] Int. Cl.$^6$ ............................................ H03F 3/45
[52] U.S. Cl. ........................ 330/254; 330/85; 330/260; 330/294
[58] Field of Search ....................... 330/69, 85, 254, 330/260, 294

[56] References Cited

U.S. PATENT DOCUMENTS

| | | | |
|---|---|---|---|
| 3,714,462 | 1/1973 | Blackmer | 307/229 |
| 4,451,798 | 5/1984 | Yokoyama | 330/85 X |

OTHER PUBLICATIONS

"Voltage–Controlled Amplifier/OVCE", model SSM–2018 produced by Analog Devices, Inc., 1981.

*Primary Examiner*—James B. Mullins
*Attorney, Agent, or Firm*—Koppel & Jacobs

[57] ABSTRACT

A current mode VCA includes a negative feedback architecture around a gain core stage. An input signal is injected as a differential current into the signal path and is converted to a differential voltage by a transresistance stage having a dynamic impedance. The differential voltage is applied to a transconductance stage which limits the VCA's high frequency gain and stabilizes the feedback loop. The transconductance stage supplies a differential drive current to the gain core stage, which produces two differential output currents that sum to the differential drive current. The fraction of the drive current provided to each output current is controlled by the application of a control signal to the gain core stage. A current-to-voltage converter produces an output voltage in response to the output current. A differential feedback current is returned to the transresistance stage to complete the negative feedback loop and control the dynamic impedance of the transresistance stage to compensate for the gain extracted from the VCA and maintain constant loop gain.

7 Claims, 3 Drawing Sheets

VOLTAGE CONTROLLED AMPLIFIER

BACKGROUND OF THE INVENTION

1. Field of the Invention

The present invention generally relates to voltage controlled amplifiers (VCAs), and more specifically to a current mode VCA that provides a constant wideband frequency response over a large gain range by maintaining constant loop gain and linearizing the loop gain for large input signals.

2. Description of the Related Art

VCAs are used to provide gain as an exponential function of a control parameter and to amplify an input signal by the selected amount of gain. In general, as the amount of gain extracted from the VCA is increased its loop gain is reduced, which in turn reduces the VCA's cut-off frequency so that its gain-bandwidth product remains constant. The result is that the effective bandwidth of the VCA is reduced at higher gain values.

VCAs are commonly used in audio systems to control the compression of an audio signal. A control circuit adjusts the VCA's control parameter as a function of the audio signal, typically its root-mean-square (RMS) value, so that the gain of the VCA is controlled to prevent clipping of audio signals that are too large and noise amplification of audio signals that are too small. This improves the perceptual quality or vocal clarity of the audio signal.

The VCA described in a product data sheet for a "Voltage-Controlled Amplifier/OVCE," model SSM-2018 produced by Analog Devices, Inc., 1981, uses a negative feedback architecture around a gain core stage to produce a differential output current and a differential feedback current. A transresistance stage comprising a pair of resistors responds to a differential input voltage and the differential feedback current to produce a differential voltage. A one pole transconductance stage uses a capacitor to limit the VCA's high frequency gain to stabilize the feedback loop and supply a differential drive current to the gain core stage. The VCA also includes a second gain core stage and a differential pair of transistors for adjusting the effective capacitance of the transconductance stage to compensate for changes in the amount of gain extracted from the VCA. This maintains a constant loop gain, and hence a constant frequency response.

The second gain core stage and its control circuitry use a large number of components to maintain the loop gain, which increases cost and reduces accuracy, and only maintains the constant frequency response for a 20 dB change in gain. The VCA's voltage feedthrough makes it very sensitive to transistor mismatch, and requires two trims to zero the resulting offset voltage. Furthermore, the VCA would preferably have better linearization of its loop gain which would increase its bandwidth.

SUMMARY OF THE INVENTION

The present invention provides a current mode VCA with control feedthrough that makes it insensitive to transistor mismatch, provides constant frequency response over a wide gain range, and linearizes its loop gain for large input signals.

This is accomplished with a negative feedback architecture around a gain core stage that is composed of two differential pairs of bipolar transistors. An input signal is injected as a differential current into the signal path and is converted to a differential voltage by a transresistance stage that is characterized by a dynamic impedance. The differential voltage is applied to a transconductance stage which limits the VCA's high frequency gain with a capacitor and stabilizes the feedback loop. The transconductance stage supplies a differential drive current to the gain core stage, which produces two differential output currents that sum to the differential drive current. A current-to-voltage converter produces an output voltage in response to the output current.

The fraction of the drive current provided to each output current is controlled by the application of a control signal to the gain core stage. A differential feedback current is returned to the transresistance stage to complete the negative feedback loop and control the dynamic impedance of the transresistance stage to compensate for the gain extracted from the VCA and maintain constant loop gain.

For a better understanding of the invention, and to show how the same may be carried into effect, reference will now be made, by way of example, to the accompanying drawings.

DETAILED DESCRIPTION OF THE INVENTION

Figure 1:
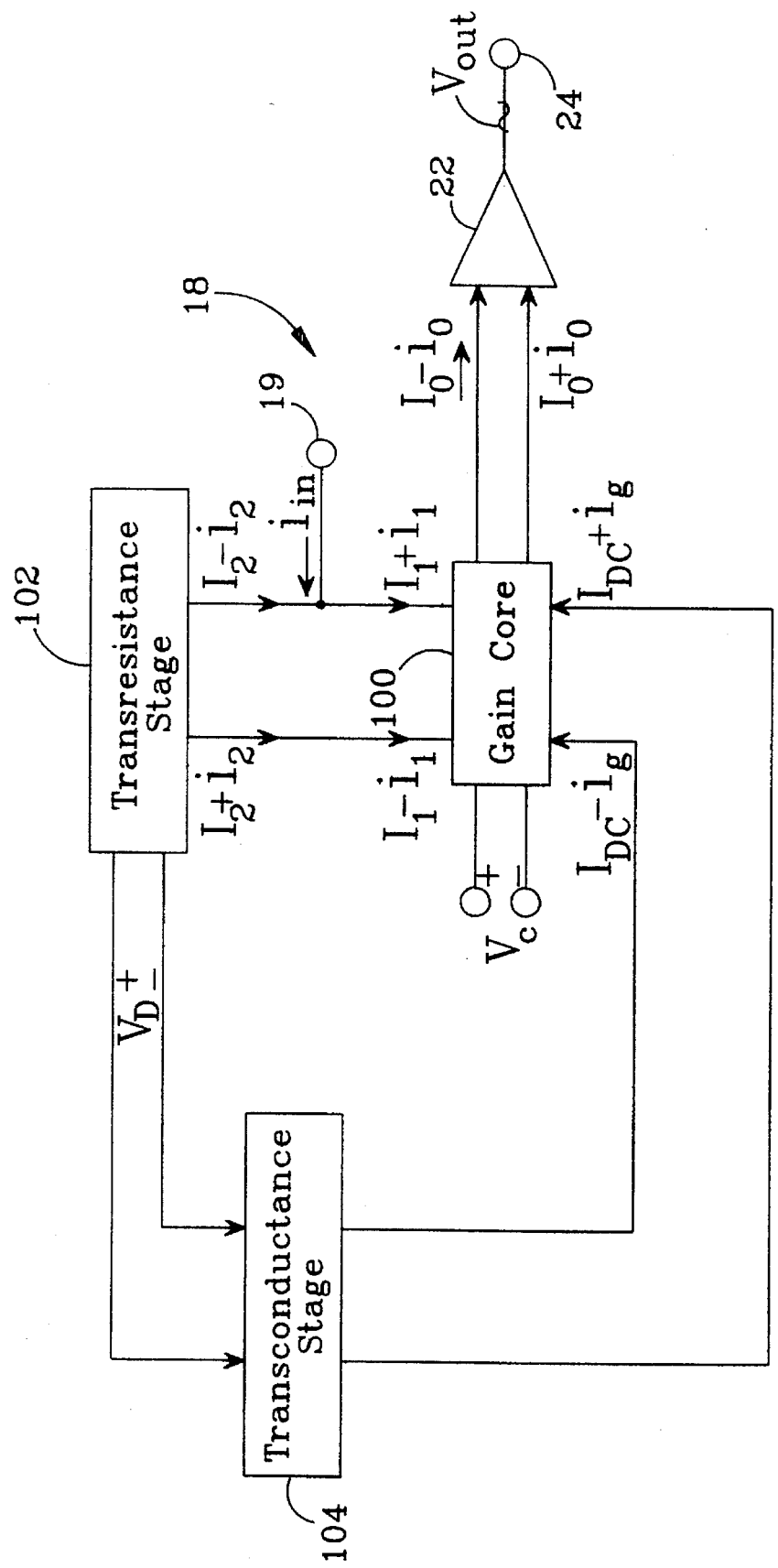
FIG. 1 is a block diagram of the VCA of the present invention.

As shown in FIG. 1, a current mode VCA 18 uses a negative feedback architecture around a differential gain core stage 100. For clarity, bias currents are designated with a capital I and AC signal currents are designated with a lower case i. An input current $i_{in}$ is injected into the signal path at current input 19 and is converted to a differential voltage $V_D$ by a transresistance stage 102 that is characterized by a dynamic impedance. The VCA's control feedthrough is reduced by holding current input 19 at a constant potential. The voltage $V_D$ is applied to a transconductance stage 104 which limits the VCA's high frequency gain with a capacitor and stabilizes the feedback loop. The transconductance stage supplies a differential drive current $(I_{DC}-i_g, I_{DC}+i_g)$, where $I_{DC}$ is the gain core's bias current and $i_g$ is the AC signal current, that drives the gain core stage 100.

The gain core stage 100 produces two differential output currents $(I_0-i_0, I_0+i_0)$ that sum to the differential drive current $(I_{DC}-i_g, I_{DC}+i_g)$ supplied to the gain core by the transconductance stage. This type of topology is known as a current mode topology and enhances the obtainable gain/bandwidth product of the VCA. The fraction G of the drive current provided to each output current is controlled by the application of a control signal $V_C$ to the gain core stage 100. The differential output current $(I_0-i_0, I_0+i_0)$ is applied to a differential current-to-voltage converter 22 to produce an output voltage $V_{out}=2Ri_0$ at its output 24 where R is the resistance of converter 22.

A differential feedback current $(I_1-i_1, I_1+i_1)$ is returned to the transresistance stage 102 to complete the negative feedback loop and control the dynamic impedance of transresistance stage 102 to compensate for the gain extracted from VCA and maintain constant loop gain. At high frequencies, the non-linear distortion in the dynamic impedance opposes the distortion in the transconductance stage. This has the effect of linearizing the loop gain at high frequencies and extending the bandwidth of the VCA.

Figure 2:
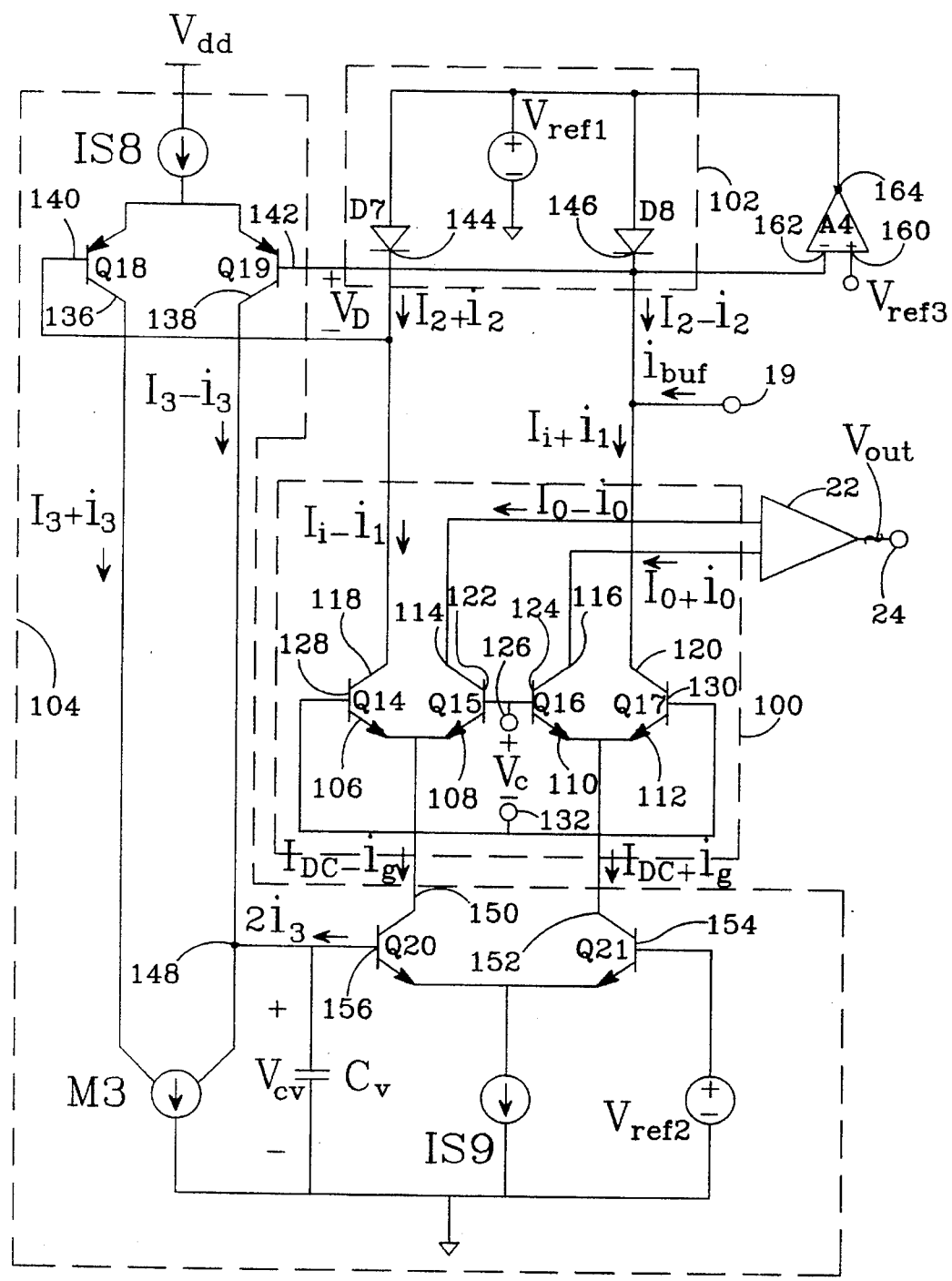
FIG. 2 is a schematic diagram illustrating a preferred implementation of the VCA shown in FIG. 1.

As shown in FIG. 2, gain core stage 100 comprises two pair of differentially connected NPN transistors Q14, Q15 and Q16, Q17. The emitters 106 and 108 of transistors Q14 and Q15, respectively, are connected and together supply the tail current $I_{DC}-i_g$, and the emitters 110 and 112 of transistors Q16 and Q17, respectively, are connected and together supply the tail current $I_{DC}+i_g$. The collectors 114 and 116 of transistors Q15 and Q16, respectively, are connected to the current-to-voltage converter 22 to supply the differential output current, and the collectors 118 and 120 of Q14 and Q17, respectively, are connected to the transresistance stage 102 to supply the differential feedback current. The bases 122 and 124 of Q15 and Q16, respectively, are connected at a positive node 126, and the bases 128 and 130 of Q14 and Q17 are connected at a negative node 132.

The control signal $V_C$ is applied across the positive and negative nodes 126, 132 causing the tail currents $I_{DC}-i_g$ and $I_{DC}+i_g$ to be split into the differential feedback and output currents, $I_1 \pm i_1$ and $I_0 \pm i_0$, respectively, where $I_0 = GI_{DC}$, $i_0 = Gi_g$, $I_1 = (1-G)I_{DC}$ and $i_1 = (1-G)i_g$. The splitting fraction G varies between 0 and 1 in response to the gain signal $V_C$ according to the following relation:

$$G = \frac{e^{V_C/V_t}}{1 + e^{V_C/V_t}} \quad (1)$$

The transresistance stage 102 comprises a pair of diodes D7, D8 that are connected between a reference voltage $V_{ref1}$, approximately 1 V lower than the high voltage supply $V_{dd}$, and the collectors 118 and 120 of transistors Q14 and Q17, respectively. Alternatively, the diodes D7 and D8 can be implemented as the emitter-base junctions of a pair of NPN transistors having a common base connection to $V_{ref1}$.

The input current $i_{in}$ in is injected into the signal path at node 19 between diode D8 and transistor Q17 such that diodes D7 and D8 conduct currents $I_2+i_2$ and $I_2-i_2$, respectively, to produce differential voltage $V_D$. Ignoring base currents, the current flowing from diode D7 is equal to the current supplied to transistor Q14's collector 118, and diode D8's current equals transistor Q17's collector current rent minus the input current $i_{in}$. Thus, $$I_2+i_2=I_1-i_1 \quad (2)$$

and $$I_2-i_2=I_1+i_1-i_{in} \quad (3)$$

Solving equations 2 and 3, $$I_2 = I_1 - \frac{i_{in}}{2} \quad (4)$$

and $$i_2 = -i_1 + \frac{i_{in}}{2} \quad (5)$$

Equation 5 shows that although the input current $i_{in}$ is injected into one side of the signal path it is effectively injected differentially. However, as described in equation 4, the bias current $I_2$ has a common mode component of $-i_{in}/2$. This common mode component is applied to both sides of the signal path and is canceled out by the transresistance stage 102.

The resistance of the transresistance stage is 2r, where r is the dynamic impedance of diodes D7 and D8. The dynamic impedance r is inversely proportional to the bias currents flowing through diodes D7 and D8. Since the bias current flowing through the diodes is provided exclusively from gain core stage 100, the bias current $I_2=(1-G)I_{DC}$ and $r=V_t/(1-G)I_{DC}$. Thus, the differential voltage $V_D$ measured across the diodes is:

$$V_D = r[(I_2+i_2)-(I_2-i_2)] = \frac{2V_t i_2}{(1-G)I_{DC}} \quad (6)$$

As the amount of gain extracted from the VCA is increased, the fraction G gets closes to 1. This increases the dynamic impedance r and differential voltage $V_D$, which has the effect of increasing the gain in the feedback path to maintain constant loop gain.

The transconductance stage 104 is a low pass filter, preferably a first order filter, that converts the differential voltage $V_D$ to the differential drive current $I_{DC}-i_g$ and $I_{DC}+i_g$, where $i_g=gm(f)V_D$. The effective transconductance function for a first order low pass filter is:

$$gm(f) = \frac{gm_0}{1 + \frac{jf}{f_0}} \quad (7)$$

where f is frequency, $f_0$ is the cutoff frequency and $gm_0$ is the low frequency gain. By rolling off the gain at high frequencies, the second order transistor effects that would otherwise become significant at higher frequencies are reduced to ensure stability.

The transconductance stage 104 comprises a current source IS8, suitably 10 µA, which supplies current from a supply voltage $V_{dd}$ to an emitter-coupled pair of PNP transistors Q18 and Q19. This causes bias currents $I_3$, approximately 5 µA, to flow through the collectors 136 and 138 of transistors Q18 and Q19, respectively. The bases 140 and 142 of transistors Q18 and Q19, respectively, are connected to cathodes 144 and 146 of diodes D7 and D8, respectively. Thus, the differential voltage $V_D$ shifts the relative base voltages of transistors Q18 and Q19, causing their collector currents $I_3$ to be perturbed by $+i_3$ and $-i_3$, respectively.

A current mirror M3 is connected to collectors 136 and 138 so that the mirror sinks a current $I_3+i_3$ at a node 148, which is connected to transistor Q19's collector 138. As a result a current $2i_3$ alternately charges and discharges a capacitor $C_V$, suitably 5 pf, that is connected between node 148 and a low supply voltage, preferably ground. Because the impedance of the capacitor $C_V$ is reduced at higher frequencies, the gain of the transconductance stage falls off as the frequency is increased.

A current source IS9 supplies tail current, suitably 2 ma, to an emitter-coupled pair of NPN transistors Q20 and Q21, whose collectors 150 and 152 are connected to emitters 106 and 108 of transistors Q14 and Q15, and to emitters 110 and 112 of transistors Q16 and Q17, respectively: this supplies the differential drive current $I_{DC}-i_g$ and $I_{DC}+i_g$, where $I_{DC}$ is nominally 1 ma. A reference voltage $V_{ref2}$, suitably 1 V plus a diode voltage above ground, is connected to base 154 of transistor Q21. Base 156 of transistor Q20 is connected to node 148 at the top of capacitor $C_V$. The base currents of transistors Q20 and Q21 are assumed zero; however, in practice this can be ensured by using Darlington pairs in place of Q20 and Q21.

At DC ($i_{in}=0$), the capacitor voltage $V_{C_V}$ is substantially equal to $V_{ref2}$, so that the tail current $2I_{DC}$ is split evenly between transistors Q20 and Q21 and $i_g=0$. When the input current $i_{in}$ is positive, $V_D$ is positive, and $2i_3$ discharges capacitor $C_V$. This lowers the voltage at transistor Q20's base relative to the voltage at transistor Q21's base and reduces the current flowing through Q20 by $i_g$. This in turn reduces the differential feedback current by $i_1$, which fights the positive input current $i_{in}$. Conversely, when $i_{in}$ is negative the capacitor $C_V$ is charged and a larger portion of the current flows through transistor Q20 providing the negative feedback that fights the negative input current.

The output voltage $V_{out}$ produced by the current-to-voltage converter 22 in response to the differential drive current is described by:

$$V_{out} = 2GRi_g \qquad (8)$$

The drive current $i_g$ produced by the transconductance stage 104 is given by:

$$i_g = gm(f)V_D \qquad (9)$$

Substituting equations 6 and 5, $i_1 = (1-G)i_g$, and solving for $i_g$ produces:

$$i_g = \frac{\frac{1}{(1-G)}}{1 + \frac{I_{DC}}{2V_t gm(f)}} \times \frac{i_{in}}{2} \qquad (10)$$

Substituting $i_g$ into equation 8, using $$\frac{G}{(1-G)} = e^{V_C/V_t}$$

and rearranging gives:

$$V_{out} = H(f) e^{v_c/v_t} R i_{in} \qquad (11)$$

where $$H(f) = \frac{1}{1 + \frac{(1 + jf/f_0) I_{DC}}{2 gm_0 V_t}} \qquad (12)$$

and $$V_{in} \approx R i_{in} \qquad (13)$$

When the loop gain $2gm_0 V_t / I_{DC}$ is much greater than 1, H(f) is approximately 1 and the input/output gain function described in equation 11 is the desired exponential function of $V_C$. Furthermore, the loop gain is held constant regardless of the amount of gain extracted from the VCA. Thus, the VCA can provide as much as 60 dB of gain at frequencies in excess of 100 Khz for a typical IC process.

Additionally the signal distortion shown by transistors, specifically the PNP emitter-coupled pair (Q18, Q19) in the transconductance stage 104, in response to large input signals is substantially canceled by the opposing distortion in the transresistance stage diodes (D7, D8).

Control feedthrough is introduced by the fact that input node 19 moves in response to gain changes. The addition of op amp A4 holds node 19 constant with gain changes. Its non-inverting 160 input is connected to a reference $V_{ref3}$. The inverting input 162 is connected to node 19. The output 164 of op amp A4 is connected to the anode of diodes D7 and D8 or preferably the bases of npn transistors used in place D7 and D8 as mentioned earlier. This establishes a negative feedback loop around op amp A4 that causes node 19 to be held at the same potential as $V_{ref3}$. Not only is control feedthrough minimized in this way, but the input impedance of the VCA is greatly reduced which improves the accuracy of the input current applied to the VCA.

Figure 3:
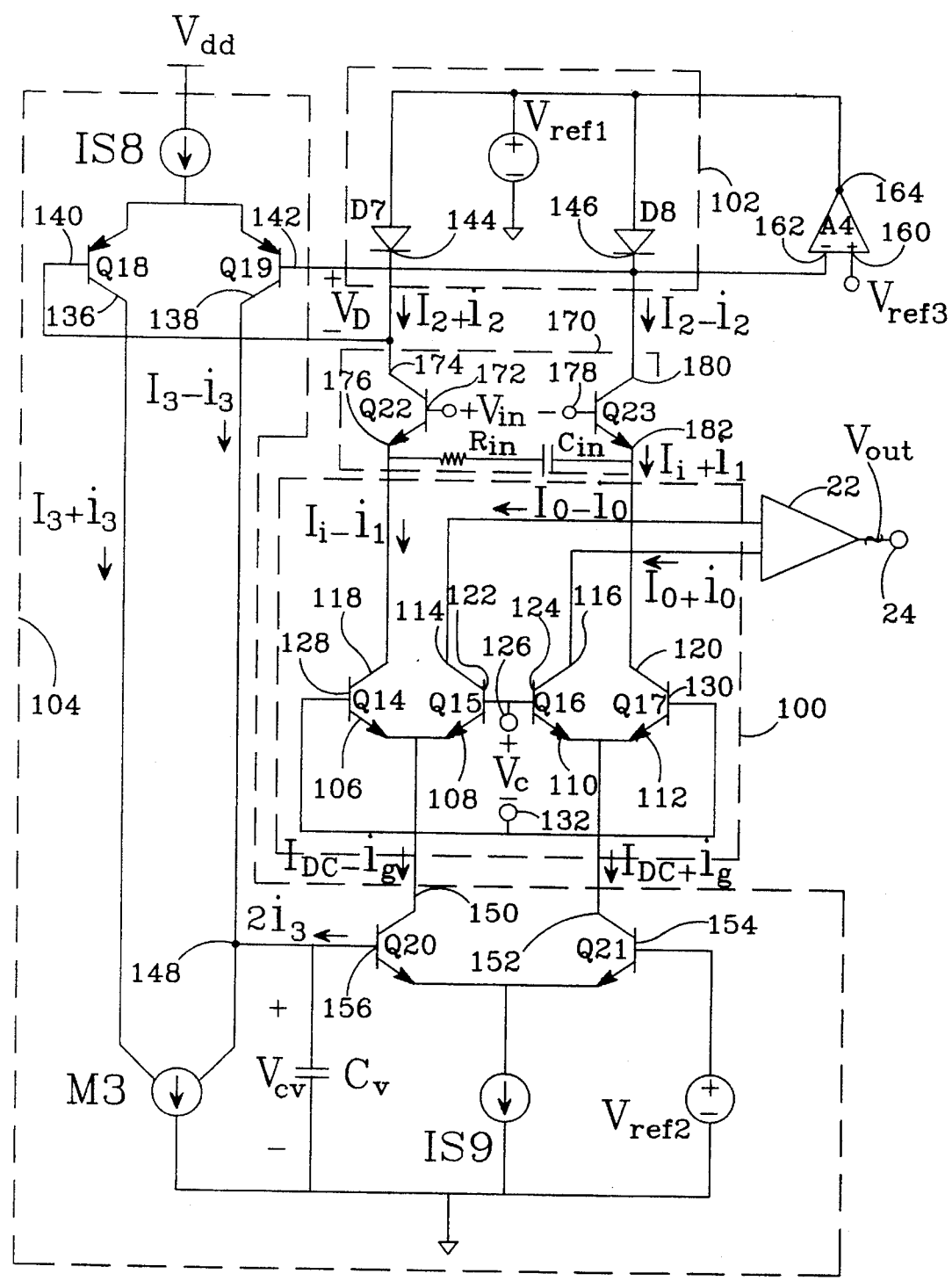
FIG. 3 is a schematic diagram illustrating an alternate implementation of the VCA shown in FIG. 1.

FIG. 3 shows an alternate embodiment of VCA 18 that includes an input stage 170 that differentially injects current $i_{in}$ into the signal path in response to a differential input voltage $V_{in}$. An npn transistor Q22 has a base 172, a collector 174 that is connected to the cathode of diode D7 and conducts $I_2+i_2$, and an emitter 176 that is connected to collector 118 of transistor Q14. An npn transistor Q23 has a base 178, a collector 180 that is connected to the cathode of diode D8 and conducts $I_2-i_2$, and an emitter 182 that is connected to collector 120 of transistor Q17. A series connection of a resistor $R_{in}$ and a capacitor $C_{in}$ is connected across emitters 176 and 182. $V_{in}$ is applied differentially across bases 172 and 178 causing $i_{in}$ to flow through the series connection of $R_{in}$ and $C_{in}$.

Input stage 170 performs two functions. First, it injects the input signal into the signal path with an input transconductance given by $1/Z_{in}$ where $Z_{in}$ is the impedance of $R_{in}$ and $C_{in}$. The time constant of $Z_{in}$ is chosen so that its impedance is essentially equal to $R_{in}$ over the desired frequency range of the input. Secondly, the input stage acts as a unity gain cascode stage between the gain core and the transresistance stage.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

I claim:

1. A voltage controlled amplifier (VCA) that amplifies an input signal by an exponential function of a control signal, said VCA having a controllable gain and a loop gain, comprising:

a gain core stage that is connected in a negative feedback signal path and has a gain control input, said gain core stage producing a differential output current and a differential feedback current;

a transresistance stage having a dynamic impedance that is inversely proportional to said differential feedback current, said transresistance stage generating a differential voltage signal in response to the input signal being injected into the signal path between the gain core and transresistance stages; and a transconductance stage that low pass filters the differential voltage to supply a differential drive current to said gain core stage that changes in response to the input signal, said control signal being applied to said gain control input to apportion a fraction G of the drive current to the differential output current to set the gain of the VCA and to apportion the remaining fraction (1−G) of the drive current to the differential feedback current to adjust the transresistance stage's dynamic impedance so that the VCA maintains its loop gain at an approximately constant value over a predetermined gain range.

2. A VCA in accordance with claim 1, wherein said transresistance stage comprises a pair of diodes that conduct the differential feedback current.

3. A VCA in accordance with claim 1, wherein said gain core stage comprises two pair of differentially connected transistors Q14, Q15 and Q16, Q17 which have respective bases and current circuits that supply said differential drive current, said control signal being applied differentially across the bases of both transistor pairs such that the fraction G of said differential drive current flows through the current circuits of transistors Q15 and Q16 to supply said differential output current and the fraction (1−G) of said differential drive current flows through the current circuits of transistors Q14 and Q17 to produce said differential feedback current.

4. A VCA in accordance with claim 3, wherein said transresistance stage comprises a pair of diodes having dynamic impedances that are inversely proportional to the differential feedback current so that the differential voltage signal is controlled to substantially offset the effect of extracting gain from the VCA and thereby maintain approximately constant loop gain.

5. A VCA in accordance with claim 4, wherein said diodes have respective anodes and cathodes, the VCA further comprising:

an operational amplifier having an inverting terminal that is connected to the cathode of a first one of said diodes, a non-inverting terminal for receiving a reference voltage signal, and an output that is connected to the anode of said first diode, said operational amplifier holding a voltage at said first diode's cathode at a substantially constant value in response to changes in said control signal to reduce the VCA's control feedthrough.

6. The VCA of claim 4, wherein said transconductance stage comprises a differential pair of bipolar transistors Q18 and Q19 having bases that are connected to the respective cathodes of the diode pair, said diodes exhibiting non-linear distortion that opposes the non-linear distortion of transistors Q18 and Q19 to linearize the VCA's loop gain.

7. A VCA in accordance with claim 1, wherein said input signal is a differential input voltage, further comprising:

an input transconductance stage that converts said differential input voltage into a differential current that is injected into the signal path to modulate the differential output current; and a current-to-voltage converter that converts the differential output current into an output voltage signal so that the VCA amplifies the differential input voltage by the exponential function of the control signal.

\* \* \* \* \*